United States Patent
Lei et al.

(10) Patent No.: US 9,608,016 B2
(45) Date of Patent: Mar. 28, 2017

(54) METHOD OF SEPARATING A WAFER OF SEMICONDUCTOR DEVICES

(71) Applicant: KONINKLIJKE PHILIPS N.V., Eindhoven (NL)

(72) Inventors: Jipu Lei, San Jose, CA (US); Alexander H. Nickel, Santa Clara, CA (US); Stefano Schiaffino, Pleasanton, CA (US); Grigoriy Basin, San Francisco, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/399,323

(22) PCT Filed: May 8, 2013

(86) PCT No.: PCT/IB2013/053719
§ 371 (c)(1),
(2) Date: Nov. 6, 2014

(87) PCT Pub. No.: WO2013/171632
PCT Pub. Date: Nov. 21, 2013

(65) Prior Publication Data
US 2015/0140711 A1    May 21, 2015

Related U.S. Application Data

(60) Provisional application No. 61/648,141, filed on May 17, 2012.

(51) Int. Cl.
*H01L 33/38* (2010.01)
*H01L 21/441* (2006.01)
(Continued)

(52) U.S. Cl.
CPC ...... *H01L 27/1266* (2013.01); *H01L 21/0273* (2013.01); *H01L 21/02697* (2013.01);
(Continued)

(58) Field of Classification Search
CPC ............ H01L 27/1266; H01L 27/1288; H01L 27/1262; H01L 33/0079
(Continued)

(56) References Cited

U.S. PATENT DOCUMENTS 7,435,606 B2 * 10/2008 Lee ................... H01L 33/0079
                                                      438/113
8,053,905 B2 * 11/2011 Epler ................... H01L 33/38
                                                      257/778
(Continued)

FOREIGN PATENT DOCUMENTS

EP         1748499 A2      1/2007
EP         2302708 A2      3/2011

*Primary Examiner* — Victor A Mandala
*Assistant Examiner* — Regan J Rundio

(57) ABSTRACT

A method according to embodiments of the invention includes providing a wafer comprising a semiconductor structure grown on a growth substrate. The semiconductor structure includes a light emitting layer disposed between an n-type region and a p-type region. The wafer includes trenches defining individual semiconductor devices. The trenches extend through an entire thickness of the semiconductor structure to reveal the growth substrate. The method further includes forming a thick conductive layer on the semiconductor structure. The thick conductive layer is configured to support the semiconductor structure when the growth substrate is removed. The method further includes removing the growth substrate.

20 Claims, 4 Drawing Sheets

(51) Int. Cl.
*H01L 21/782* (2006.01)
*H01L 21/3205* (2006.01)
*H01L 27/12* (2006.01)
*H01L 21/02* (2006.01)
*H01L 21/027* (2006.01)
*H01L 21/78* (2006.01)
*H01L 21/445* (2006.01)
*H01L 33/00* (2010.01)

(52) U.S. Cl.
CPC .......... *H01L 21/441* (2013.01); *H01L 21/445* (2013.01); *H01L 21/7806* (2013.01); *H01L 27/1262* (2013.01); *H01L 27/1288* (2013.01); *H01L 33/0062* (2013.01); *H01L 33/0079* (2013.01); *H01L 33/0083* (2013.01); *H01L 33/38* (2013.01); *H01L 33/385* (2013.01); *H01L 33/0095* (2013.01); *H01L 2933/0016* (2013.01)

(58) Field of Classification Search
USPC ...................................... 438/33, 34
See application file for complete search history.

(56) References Cited

U.S. PATENT DOCUMENTS

| | | | | |
|---|---|---|---|---|
| 2006/0001035 A1* | 1/2006 | Suehiro | ............... | H01L 33/38 257/91 |
| 2007/0020789 A1* | 1/2007 | Lee | ................... | H01L 33/0079 438/22 |
| 2007/0077673 A1* | 4/2007 | Hwang | ............... | H01L 33/0079 438/46 |
| 2007/0087644 A1* | 4/2007 | Iwafuchi | ............. | H01L 21/2007 445/1 |
| 2007/0181891 A1* | 8/2007 | Eisert | ................... | H01L 33/20 257/82 |
| 2009/0093075 A1* | 4/2009 | Chu | ..................... | H01L 33/0079 438/33 |
| 2010/0203661 A1* | 8/2010 | Hodota | ............... | H01L 33/0079 438/29 |
| 2011/0018013 A1* | 1/2011 | Margalith | ............. | H01L 27/153 257/91 |
| 2011/0073900 A1* | 3/2011 | Sugizaki | ................ | H01L 24/02 257/99 |
| 2011/0114987 A1* | 5/2011 | Epler | ..................... | H01L 33/38 257/99 |
| 2011/0266569 A1* | 11/2011 | Basin | ................... | H01L 33/0079 257/98 |
| 2011/0284910 A1* | 11/2011 | Iduka | ................... | H01L 33/385 257/99 |
| 2011/0297980 A1* | 12/2011 | Sugizaki | ................ | H01L 33/38 257/98 |
| 2013/0320382 A1* | 12/2013 | Kojima | ................ | H01L 33/44 257/98 |
| 2014/0339597 A1* | 11/2014 | Schiaffino | ........... | H01L 33/0079 257/99 |

\* cited by examiner

METHOD OF SEPARATING A WAFER OF SEMICONDUCTOR DEVICES

CROSS-REFERENCE TO PRIOR APPLICATIONS

This application is the U.S. National Phase application under 35 U.S.C. §371 of International Application No. PCT/IB2013/053719, filed on May 8, 2013, which claims the benefit of U.S. Patent Application No. 61/648,141, filed on May 17, 2012. These applications are hereby incorporated by reference herein.

FIELD OF THE INVENTION

The present invention relates to a method of separating a wafer of semiconductor devices into individual devices.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Semiconductor devices are typically grown on a wafer, such that many devices are grown at once. After the wafer is processed, for example to form electrical contacts on each device, the wafer is diced. In the case of a III-nitride device wafer, dicing often requires sawing through III-nitride material, metal layers, and/or molding compound. Sawing is time consuming and can cause damage to the semiconductor devices, which may reduce yield.

SUMMARY

It is an object of the invention to provide a process for singulating a wafer of semiconductor devices that does not require mechanical or laser dicing.

A method according to embodiments of the invention includes providing a wafer comprising a semiconductor structure grown on a growth substrate. The semiconductor structure includes a light emitting layer disposed between an n-type region and a p-type region. The wafer includes trenches defining individual semiconductor devices. The trenches extend through an entire thickness of the semiconductor structure to reveal the growth substrate. The method further includes forming a thick conductive layer on the semiconductor structure. The thick conductive layer is configured to support the semiconductor structure when the growth substrate is removed. The method further includes removing the growth substrate.

A structure according to embodiments of the invention includes a semiconductor structure including a III-nitride light emitting layer disposed between an n-type region and a p-type region. A thick conductive layer is disposed on the semiconductor structure. The thick conductive layer mechanically supports the semiconductor structure. A coefficient of thermal expansion of the thick conductive layer differs from a coefficient of thermal expansion of GaN by no more than 10%.

DETAILED DESCRIPTION

In embodiments of the invention, a semiconductor light emitting device includes thick metal layers which provide mechanical support and electrical connection to the semiconductor layers. Though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
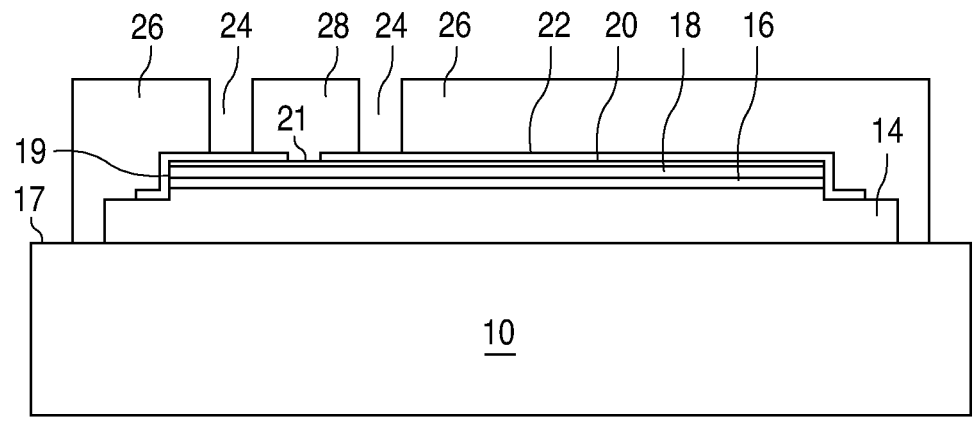
FIG. 1 is a cross sectional view of a semiconductor LED suitable for use in embodiments of the present invention.

FIG. 1 illustrates a semiconductor light emitting diode suitable for use in embodiments of the invention. The device illustrated in FIG. 1 is just one example of a device that may be used with embodiments of the invention. Any suitable device may be used with embodiments of the invention—embodiments of the invention are not limited to the details illustrated in FIG. 1. For example, though FIG. 1 illustrates a flip-chip device, embodiments of the invention may be used with other device geometries and are not limited to flip-chip devices.

The device illustrated in FIG. 1 may be formed by first growing a semiconductor structure on a growth substrate 10, as is known in the art. The growth substrate 10 may be any suitable substrate such as, for example, sapphire, SiC, Si, GaN, non-III-nitride materials, or composite substrates. An n-type region 14 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 16 is grown over the n-type region. Examples of suitable light emitting regions include a single thick or thin light emitting layer, or a multiple quantum well light emitting region including multiple thin or thick light emitting layers separated by barrier layers. A p-type region 18 may then be grown over the light emitting region. Like the n-type region, the p-type region may include multiple layers of different composition, thickness, and dopant concentration, including layers that are not intentionally doped, or n-type layers. The total thickness of all the semiconductor material in the device is less than 10 µm in some embodiments and less than 6 µm in some embodiments. In some embodiments, the p-type region may be grown first on the growth substrate, followed by the active region and the n-type region.

A p-contact metal 20 is formed on the p-type region. The p-contact metal 20 may be reflective and may be a multi-layer stack. For example, the p-contact metal may include a layer for making ohmic contact to the p-type semiconductor material, a reflective metal layer, and a guard metal layer that prevents or reduces migration of the reflective metal. The semiconductor structure is then patterned by standard photolithographic operations and etched to remove a portion of the entire thickness of the p-contact metal, a portion of the entire thickness of the p-type region, and a portion of the entire thickness of the light emitting region, to form at least one mesa 19 which reveals a surface of the n-type region 14. A dielectric layer 22 is then formed and patterned to cover the side wall of mesa 19 where the light emitting region 16 is exposed. Dielectric layer 22 does not cover a portion 17 of n-type region 14 at the edge of the semiconductor structure illustrated in FIG. 1. A small opening 21 formed in dielectric layer 22 provides electrical access to the p-contact metal 18. Thick n- and p-metal layers, 26 and 28 respectively, are formed over the structure and electrically isolated from each other by gap 24

Figure 2:
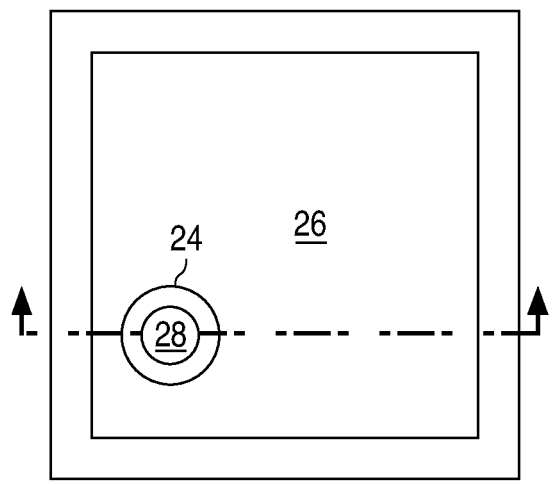
FIG. 2 is a plan view of the device illustrated in FIG. 1.

FIG. 2 is a plan view of the device illustrated in FIG. 1. P-contact 28 is round in FIG. 2, though it may have any suitable shape. N-contact 26 surrounds p-contact 28. The n-contact and the p-contact are electrically isolated by a gap 24 which may be filled with a solid, a dielectric, an electrically insulating material, air, ambient gas, polymer, silicone, or any other suitable material. The p- and n-contacts may be any suitable shape and may be arranged in any suitable way. Patterning a semiconductor structure and forming n- and p-contacts is well known to a person of skill in the art. Accordingly, the shape and arrangement of the n- and p-contacts is not limited to the embodiment illustrated in FIGS. 1 and 2.

Figure 3:
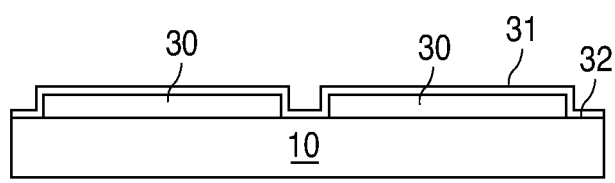
FIG. 3 illustrates two LED structures on a growth substrate.

Though a single light emitting device is illustrated in FIGS. 1 and 2, it is to be understood that the device illustrated in FIGS. 1 and 2 is formed on a wafer that includes many such devices. The structure illustrated in FIG. 1, including n-type region 14, active region 16, p-type region 18, p-contact 20, dielectric layer 22, and thick p-contact 28, and thick n-contact 26, is for simplicity represented in the following figures as LED structure 30. Two LED structures 30 are illustrated in FIG. 3 on growth substrate 10. In the regions 32 between individual devices on a wafer of devices, a trench may be etched through the semiconductor structure. The bottom of the trench may expose an insulating layer, which may be an insulating semiconductor layer that is part of the semiconductor structure, or the trench may extend through an entire thickness of the semiconductor structure to reveal growth substrate 10, as illustrated in FIG. 3. One or more additional electrically insulating layers (not shown in FIG. 3) may be formed over the top of the LED structure 30 and patterned to form openings where electrical contact is made with the thick conductive layers described in the text accompanying FIG. 5. Such electrically insulating layers provide electrical isolation and forming them is known in the art.

One or more thin conductive layers 31 are formed over the top surface of the structure illustrated in FIG. 3. The thin conductive layers 31 may include an adhesion layer, the material of which is selected for good adhesion to the n- and p-contacts, and a seed layer, the material of which is selected for good adhesion to thick conductive layers formed over the thin conductive layers and described below in the text accompanying FIG. 5. Examples of suitable materials for the adhesion layer include but are not limited to Ti, W, and alloys such as TiW. Examples of suitable materials for the seed layer include but are not limited to Cu. The adhesion layer, if present, and seed layer may be formed by any suitable technique including, for example, sputtering or evaporation.

Figure 4:
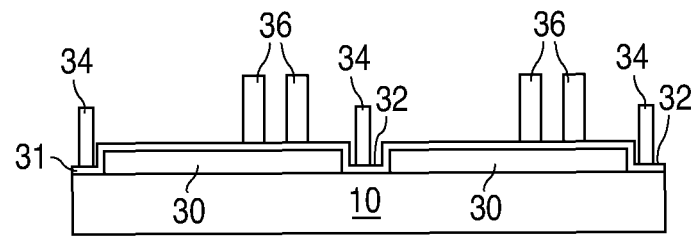
FIG. 4 illustrates the structure of FIG. 3 after forming a seed layer and patterning the seed layer with photoresist.

In FIG. 4, a photoresist layer is formed over the seed layer, then patterned. After patterning, photoresist layer 34 remains in a portion of the areas 32 between LEDs 30. In the alternative, photoresist layer 34 may remain in all of the areas 32 between LEDs 30. On each LED 30, photoresist layer 36 is formed and patterned to define an area that electrically isolates a thick metal layer electrically connected to the p-type contact 28 (shown in FIG. 1) from a thick metal layer electrically connected to the n-type contact 26. The photoresist may be patterned such that the thickness of photoresist region 36, formed on the device, is greater than the thickness of photoresist region 34, formed in a region between two devices. In some embodiments, two different photoresists that are stripped with different solvents that do not strip the other photoresist are used to separately form photoresist regions 36 and 34. In some embodiments, the same photoresist is used for both regions 36 and 34 and multiple patterning steps are performed such that extra photoresist is left in region 36, resulting in a thicker photoresist layer. In some embodiments, photoresist region 34 is selectively etched to reduce its thickness as compared to photoresist region 36.

Figure 5:
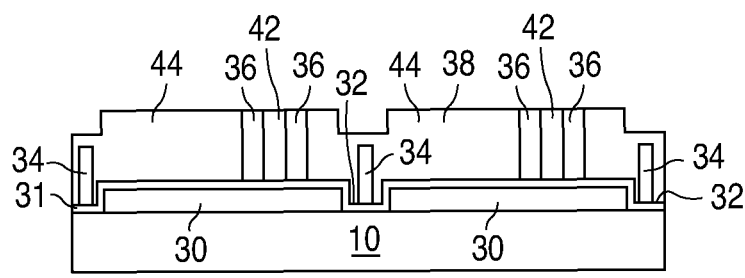
FIG. 5 illustrates the structure of FIG. 4 after forming a thick conductive layer on the seed layer.

In FIG. 5, a thick conductive layer 38 is formed on the portions of the seed layer that are not covered by photoresist layers 34 and 36. Thick conductive layer 38 may be, for example, any suitable metal such as, for example, copper, nickel, gold, palladium, nickel-copper alloy, or other alloys.

Thick conductive layer 38 may be formed by any suitable technique, including, for example, plating. Thick conductive layer 38 may be at least 20 µm thick in some embodiments, no more than 500 µm thick in some embodiments, at least 30 µm thick in some embodiments, no more than 200 µm thick in some embodiments, at least 50 µm thick in some embodiments, and no more than 100 µm in some embodiments. Thick conductive layer 38 supports the semiconductor structure during later processing steps, in particular removal of the growth substrate, and provides a thermal pathway to conduct heat away from the semiconductor structure, which may improve the efficiency of the device.

A first portion 42 of thick conductive layer 38 makes electrical contact to p-contact 28, and a second portion 44 of thick conductive layer 38 makes electrical contact to n-contact 26. After forming thick conductive layer 38 and before planarizing as described in reference to FIG. 8, the thick conductive layer 38 grows over during deposition and covers photoresist 34 in the regions 32 between neighboring LEDs 30. The thick conductive layer 38 does not cover the photoresist 36 disposed over LEDs 30.

Figure 6:
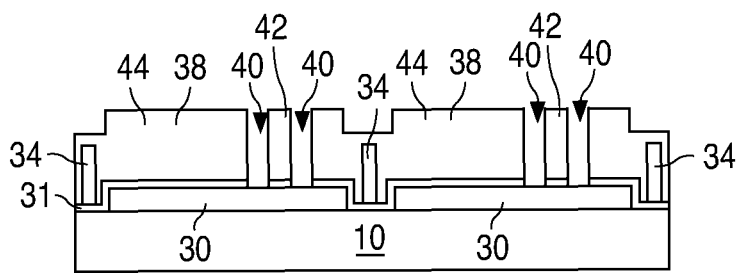
FIG. 6 illustrates the structure of FIG. 5 after removing the photoresist.

In FIG. 6, the exposed photoresist 36 is removed, leaving openings 40 in the thick metal layer. The openings define the first portion 42 and second portion 44 of thick conductive layer 38. The seed layer and any other thin conductive layers 31 underlying photoresist 36 may then be removed by wet or dry etching, for example, in separate steps. Because photoresist 34 is covered by thick conductive layer 38, photoresist 34 between LEDs 30 is not removed at the same time as photoresist 36.

Figure 7:
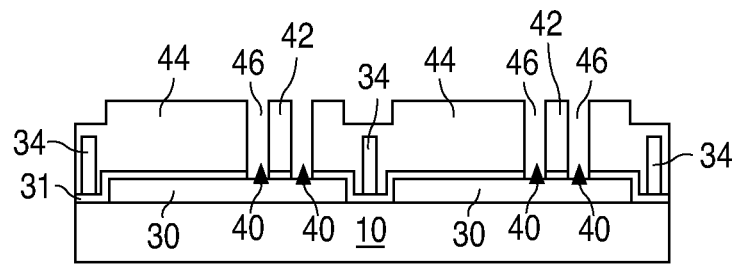
FIG. 7 illustrates the structure of FIG. 6 after filling any gaps with electrically insulating material.

In FIG. 7, openings 40 are filled with electrically insulating material 46. The electrically insulating material may optionally be formed over the tops of thick conductive layer 38. Electrically insulating material 46 is selected to electrically isolate thick conductive layer portions 42 and 44.

Electrically insulating material 46 may be formed by any suitable technique, including, for example, overmolding, injection molding, spinning on, and spraying on. Overmolding is performed as follows: An appropriately sized and shaped mold is provided. The mold is filled with a liquid material, such as silicone, epoxy, or molding compound, which when cured forms a hardened electrically insulating material. The mold and the LED wafer are brought together. The mold is then heated to cure (harden) the electrically insulating material. The mold and the LED wafer are then separated, leaving the electrically insulating material 46 filling any gaps on the structure. In some embodiments, one or more fillers are added to the molding compound to form composite materials with optimized physical and material properties.

Figure 8:
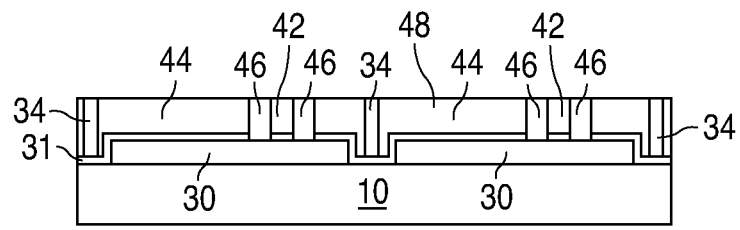
FIG. 8 illustrates the structure of FIG. 7 after planarizing the top surface.

In FIG. 8 the device is planarized, for example by removing excess thick conductive material 38 and insulating material 46 to form a substantially planar top surface 48. Excess thick conductive material 38 may be removed by any suitable technique, including mechanical techniques such as grinding. The photoresist 34 in the area between neighboring LEDs 30 is exposed by the planarizing illustrated in FIG. 8.

Figure 9:
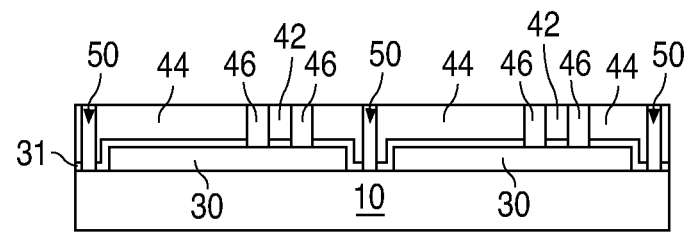
FIG. 9 illustrates the structure of FIG. 8 after removing the photoresist exposed by planarizing.

In FIG. 9, photoresist 34 of FIG. 8 is removed, leaving openings 50 between neighboring LEDs 30. In some embodiments, the seed layer and any other thin conductive layers 31 underlying photoresist 34 are removed by wet or dry etching, for example, at the same time as photoresist 34 or in one or more separate steps. In some embodiments, the thin conductive layers 31 are not removed from the growth substrate. The openings 50 extend through an entire thickness of LEDs 30 and thick conductive layer 38. Removing photoresist 34 from openings 50 exposes the growth substrate 10 in some embodiments, and the thin conductive layers 31, if present. After photoresist 34 is removed, neighboring LEDs 30 are connected to each other only through growth substrate 10, and thin conductive layers 31, if present.

Figure 12:
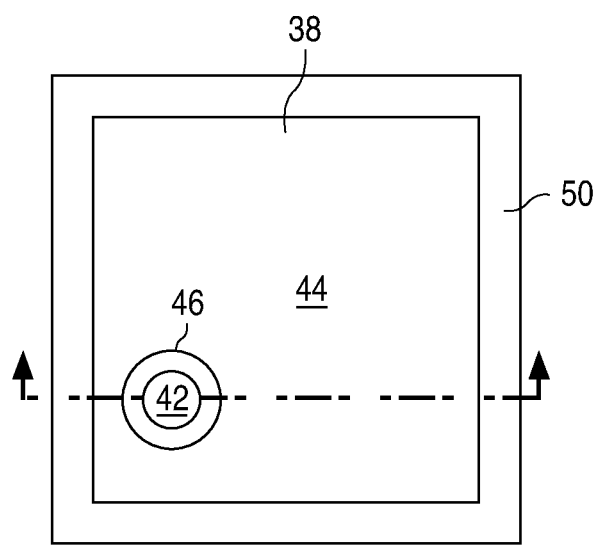
FIG. 12 is a plan view of one of the devices illustrated in FIG. 9.

FIG. 12 is a plan view of one of the devices illustrated in FIG. 9. Portion 42 of thick conductive layer 38 is round in FIG. 12, though it may be any suitable shape. Electrically insulating layer 46 isolates portion 42 from portion 44 of thick conductive layer 38, which surrounds portion 42. Openings 50 surround the device illustrated in FIG. 12. The devices illustrated in FIG. 9 are simplified cross sections taken at the axis indicated in FIG. 12.

Figure 10:
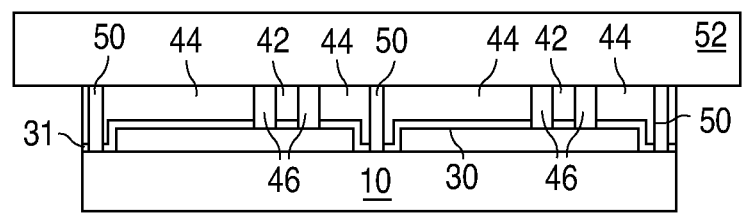
FIG. 10 illustrates the device of FIG. 9 after attaching a wafer handling structure.

In FIG. 10, the top of the semiconductor wafer of FIG. 9 (i.e. the surface that is planarized in FIG. 8), is attached to a wafer handling structure 52 such as wafer handling tape.

Figure 11:
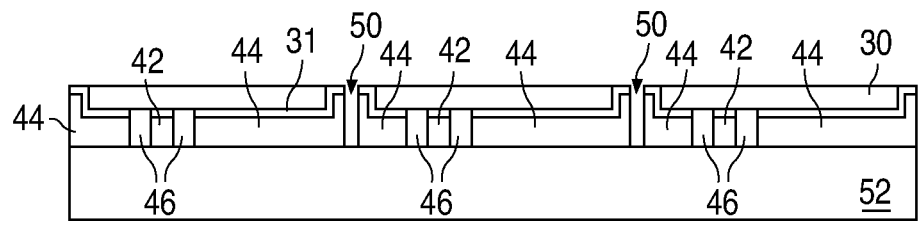
FIG. 11 illustrates three LEDs attached to a wafer handling structure after removing the growth substrate.

In FIG. 11, the structure illustrated in FIG. 10 is flipped over and growth substrate 10 is removed by any suitable technique. For example, a sapphire growth substrate may be removed by laser lift off. Other suitable techniques for removing the substrate 10 include etching and mechanical techniques such as grinding. Releasing LEDs 30 from growth substrate 10 also singulates LEDs 30 into individual devices, because openings 50 extend through the entire thickness of LEDs 30 and thick conductive layer 38. Thin conductive layers 31 in openings 50, if present, may be destroyed by removing growth substrate 10, or may separate (i.e. break apart) after growth substrate 10 is removed. No sawing is required to singulate LEDs 30. Wafer handling structure 52 can simply be stretched in order to separate LEDs 30.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A method comprising;
providing a wafer comprising a semiconductor structure grown on a growth substrate, the semiconductor structure comprising a light emitting layer disposed between an n-type region and a p-type region, the wafer comprising trenches defining individual semiconductor devices, wherein the trenches extend through an entire thickness of the semiconductor structure to reveal the growth substrate, and wherein each individual semiconductor device comprises an n-contact connected to the n-type region and a p-contact connected to the p-type region, wherein the n- and p-contacts are formed on a same side of the semiconductor structure and wherein the n-contact surrounds the p-contact;
forming a thick conductive layer on the semiconductor structure, wherein the thick conductive layer is configured to support the semiconductor structure when the growth substrate is removed;
attaching the wafer to temporary wafer handling tape; and
removing the growth substrate, wherein immediately prior to removing the growth substrate, neighboring semiconductor devices are connected only through the growth substrate and through the temporary wafer handling tape;
wherein the thick conductive layer is a first thick conductive layer, the method further comprising forming a second thick conductive layer on the semiconductor structure, wherein the first thick conductive layer surrounds the second thick conductive layer, and the first and second thick conductive layers are separated by an insulating layer.

2. The method of claim 1 wherein the thick conductive layer is not formed in at least a portion of the trenches defining individual semiconductor devices such that after forming the thick conductive layer, the trenches extend through an entire thickness of the semiconductor structure and the thick conductive layer.

3. The method of claim 1 wherein forming a thick conductive layer on the semiconductor structure comprises:
forming a seed layer on a surface of the wafer;
forming a photoresist layer over the seed layer; and patterning the photoresist layer to form openings, wherein after patterning a region of photoresist layer is disposed in the trenches defining individual semiconductor devices.

4. The method of claim 3 wherein forming a thick conductive layer comprises plating a thick metal layer in the openings formed in the photoresist layer, wherein after plating the thick metal layer is disposed over the regions of photoresist layer disposed in the trenches.

5. The method of claim 4 further comprising after plating a thick metal layer, removing a first portion of the photoresist layer, wherein the first portion of the photoresist layer is disposed over an individual semiconductor device.

6. The method of claim 5 further comprising after removing the first portion of the photoresist layer, planarizing a top surface of the wafer, wherein planarizing exposes tops of the regions of photoresist layer disposed in the trenches.

7. The method of claim 6 further comprising after planarizing, removing a second portion of the photoresist, the second portion comprising the regions of photoresist layer disposed in the trenches.

8. The method of claim 1 further comprising disposing an electrically insulating material in openings in the thick conductive layer.

9. The method of claim 8 wherein disposing an electrically insulating material in openings in the thick conductive layer comprises molding electrically insulating material in the openings in the thick conductive layer.

10. The method of claim 1 wherein the growth substrate is one of a non-III-nitride material substrate and a sapphire substrate.

11. A method comprising;
providing a wafer comprising a semiconductor structure grown on a growth substrate, the semiconductor structure comprising a light emitting layer disposed between an n-type region and a p-type region, the wafer comprising trenches defining individual semiconductor devices, wherein the trenches extend through an entire thickness of the semiconductor structure to reveal the growth substrate, and wherein each individual semiconductor device comprises an n-contact connected to the n-type region and a p-contact connected to the p-type region, wherein the n- and p-contacts are formed on a same side of the semiconductor structure and wherein the n-contact surrounds the p-contact;
forming a thick conductive layer on the semiconductor structure, wherein the thick conductive layer is configured to support the semiconductor structure when the growth substrate is removed;
attaching the wafer to temporary wafer handling tape; and
removing the growth substrate, wherein immediately prior to removing the growth substrate, neighboring semiconductor devices are connected only through the growth substrate and through the temporary wafer handling tape;
wherein forming a thick conductive layer comprises:
forming a seed layer on a surface of the wafer;
forming a photoresist layer over the seed layer;
patterning the photoresist layer to form openings, wherein after patterning a region of photoresist layer is disposed in the trenches defining individual semiconductor devices; and
plating a thick metal layer in the openings formed in the photoresist layer, wherein after plating the thick metal layer is disposed over the regions of photoresist layer disposed in the trenches.

12. The method of claim 11 further comprising after plating a thick metal layer, removing a first portion of the photoresist layer, wherein the first portion of the photoresist layer is disposed over an individual semiconductor device.

13. The method of claim 12 further comprising after removing the first portion of the photoresist layer, planarizing a top surface of the wafer, wherein planarizing exposes tops of the regions of photoresist layer disposed in the trenches.

14. The method of claim 13 further comprising after planarizing, removing a second portion of the photoresist, the second portion comprising the regions of photoresist layer disposed in the trenches.

15. A method comprising;
providing a wafer comprising a semiconductor structure grown on a growth substrate, the semiconductor structure comprising a III-nitride light emitting layer disposed between an n-type region and a p-type region, the wafer comprising trenches defining individual semiconductor devices, wherein the trenches extend through an entire thickness of the semiconductor structure to reveal the growth substrate, and wherein each individual semiconductor devices comprises an n-contact connected to the n-type region and a p-contact connected to the p-type region, wherein the n- and p-contacts are formed on a same side of the semiconductor structure;
forming regions of a first material in the trenches;
after forming regions of a first material in the trenches, forming a thick conductive layer on the semiconductor structure, wherein the thick conductive layer is configured to support the semiconductor structure when the growth substrate is removed and wherein the thick conductive layer has a lateral extent that extends beyond an edge of the semiconductor structure;
removing the regions of first material;
attaching the wafer to a wafer handling structure; and
removing the growth substrate, wherein immediately prior to attaching the wafer to a wafer handling structure and removing the growth substrate, neighboring semiconductor devices are connected only through the growth substrate;
wherein the thick conductive layer is a first thick conductive layer, the method further comprising forming a second thick conductive layer on the semiconductor structure, wherein the first thick conductive layer surrounds the second thick conductive layer, and the first and second thick conductive layers are separated by an insulating layer.

16. The method of claim 15 further comprising stretching the wafer handling structure to separate neighboring semiconductor devices.

17. The method of claim 1 wherein the thick conductive layer has a lateral extent that extends beyond an edge of the semiconductor structure.

18. The method of claim 15 wherein the n-contact surrounds the p-contact.

19. The method of claim 15 wherein the thick conductive layer is not formed in at least a portion of the trenches defining individual semiconductor devices such that after forming the thick conductive layer, the trenches extend through an entire thickness of the semiconductor structure and the thick conductive layer.

20. The method of claim 15 wherein the growth substrate is one of a non-III-nitride material substrate and a sapphire substrate.

* * * * *